United States Patent [19]

Russell

[11] 3,953,866

[45] Apr. 27, 1976

[54] CROSS COUPLED SEMICONDUCTOR MEMORY CELL

[75] Inventor: Lewis K. Russell, San Jose, Calif.

[73] Assignee: Signetics Corporation, Sunnyvale, Calif.

[22] Filed: May 10, 1974

[21] Appl. No.: 468,938

[52] U.S. Cl. .................................. 357/44; 357/15; 357/46; 357/48; 307/238; 307/288
[51] Int. Cl.² .................. H01L 27/02; H01L 27/04; H03K 5/00; H03K 3/26
[58] Field of Search .................. 357/44, 46, 48, 15; 307/238, 288

[56] References Cited
UNITED STATES PATENTS 3,643,235  2/1972  Berger et al. ........................ 357/44
3,761,898  9/1973  Pa. ...................................... 357/48

Primary Examiner—Andrew J. James
Assistant Examiner—E. Wojciechowicz
Attorney, Agent, or Firm—Hohbach, Test, Albritton & Herbert, Flehr

[57] ABSTRACT

A semiconductor memory cell, and a method for fabrication, including a one conductivity semiconductor body having a major surface and an opposite conductivity layer formed on said major surface said layer having a planar surface. Means extend from said planar surface through said layer to contact said body for isolating portions of said layer into first and second device regions. First and second device regions each include a one conductivity region formed in said device region extending to said planar surface, an opposite conductivity region formed within said one conductivity regions extending to said surface, and a metal-to-semiconductor contact carried by said device region at said planar surface. Lead means include means for ohmic interconnection of opposite conductivity regions formed in said first and second device regions, means for interconnecting said first device region and said one conductivity region formed in said second device region. Lead means further includes means for interconnection of said second device region and said one conductivity region formed in said first device region. Additional lead means is provided for coupling said metal-to-semiconductor contacts, said semiconductor body and said interconnected opposite conductivity regions with external circuitry.

8 Claims, 11 Drawing Figures

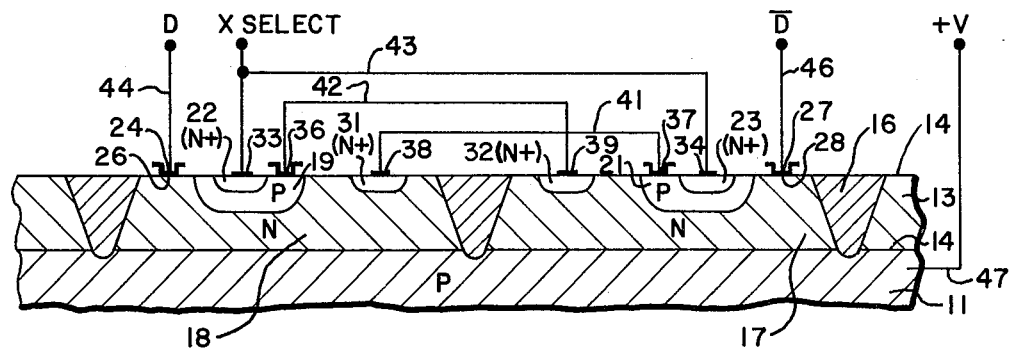
FIG.—1A
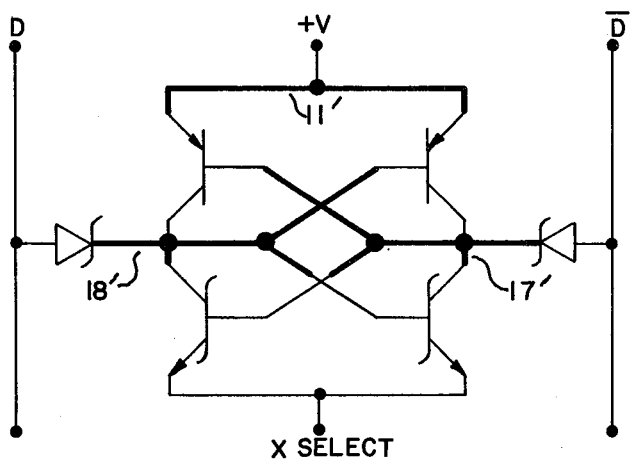
FIG.—1B
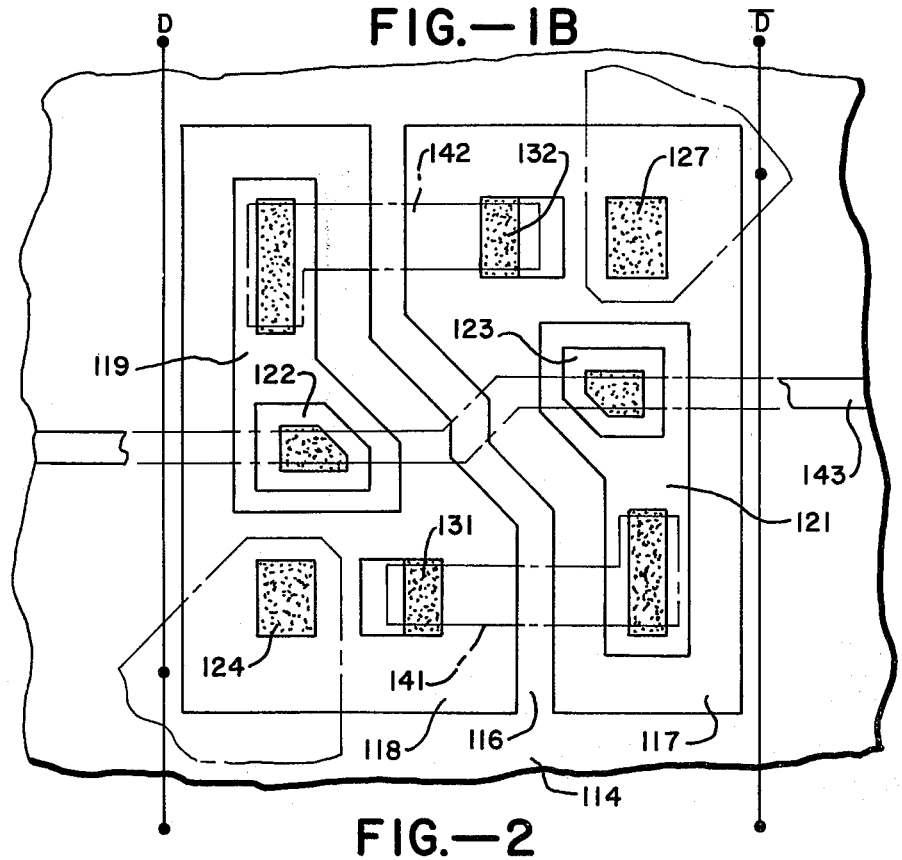
FIG.—2

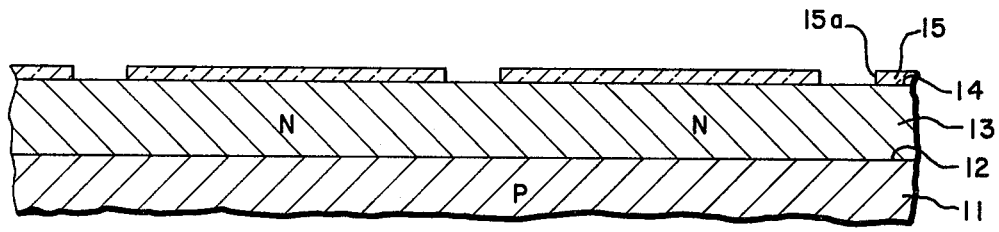
FIG.—3A
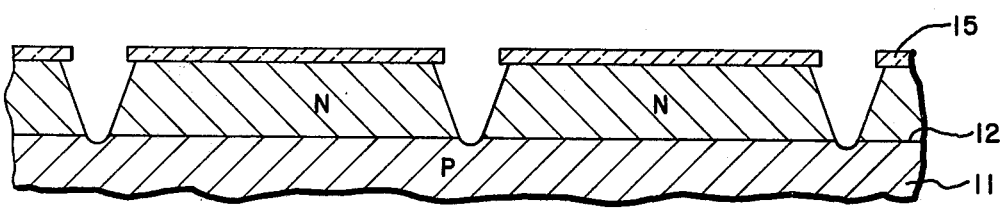
FIG.—3B
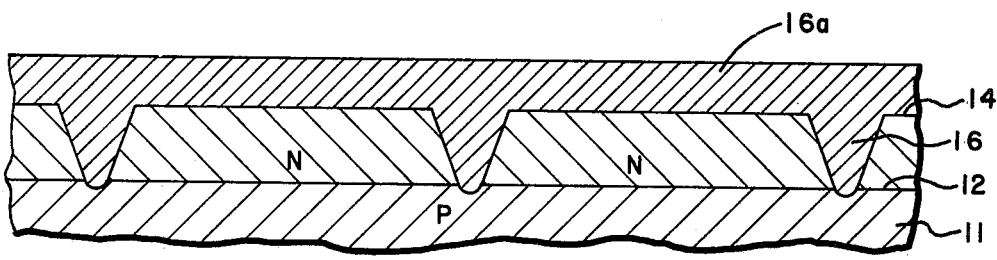
FIG.—3C
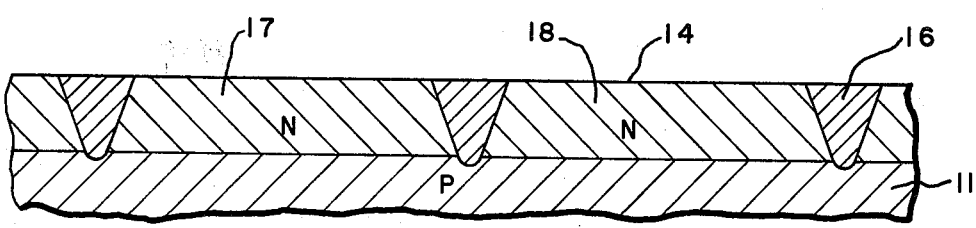
FIG.—3D

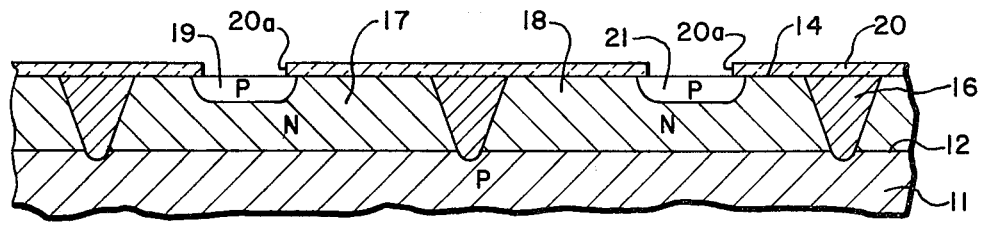
FIG.—3E
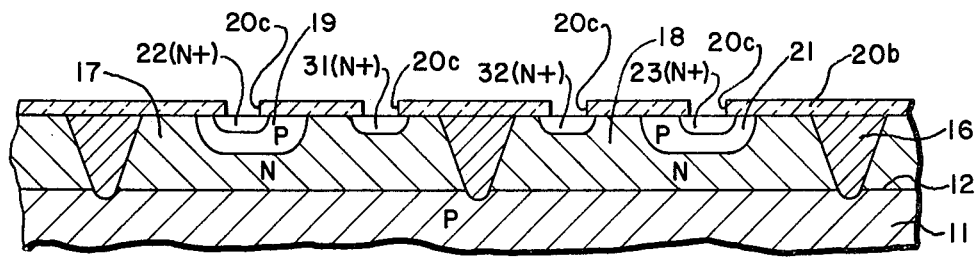
FIG.—3F
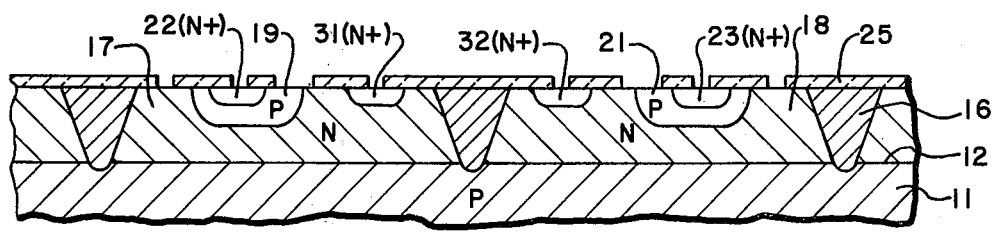
FIG.—3G
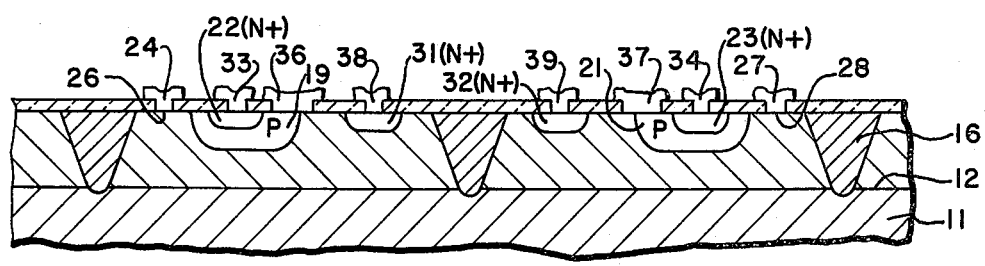
FIG.—3H

CROSS COUPLED SEMICONDUCTOR MEMORY CELL

BACKGROUND OF THE INVENTION

This invention relates generally to a bipolar semiconductor switching structure and a method for fabrication. More particularly, this invention relates to a cross-coupled bipolar semiconductor switching structure suitable for logic circuitry and capable of relatively high speed operation.

Although cross-coupled, SCR-type, semiconductor memory cells are known in the art, they require excessive device regions and extra processing steps in forming th regions. Many prior art devices utilize laterally configured PNP regions, and a multiplicity of interconnections between the various regions. Thus there is a need for a semiconductor memory cell which requires fewer device regions and which may be fabricated by less complex processing steps than presently known in the art.

OBJECTS AND SUMMARY OF THE INVENTION

Accordingly, it is a general object of the present invention to provide a high performance semiconductor switching structure suitable for use as a memory cell.

It is a particular object of the present invention to provide an improved semiconductor switching structure requiring fewer device regions, contacts and interconnections than presently known in the art.

It is a further object to provide a semiconductor memory cell which is capable of high speed, low power operation and which may be fabricated by greatly simplified processing steps.

The foregoing and other objects of the invention are achieved in a semiconductor memory cell, and method for fabrication, including a one conductivity semiconductor body having a major surface, and an opposite conductivity layer formed on said major surface, said layer having a planar surface. Means extends from said planar surface through said layer to contact said body for isolating portions of said layer to form first and second device regions. The first and second device regions each include a one conductivity region formed in said device region extending to said planar surface, an opposite conductivity region formed within said one conductivity region and extending to said surface, and a metal-to-semiconductor contact carried by said device region at said planar surface. Lead means includes means for ohmic interconnection of opposite conductivity regions formed in said first and second device regions and means for interconnection of said first device region and said one conductivity region formed in said second device region. Lead means further includes means for interconnection of said second device region and said one conductivity region formed in said first device region. Additional lead means is provided for coupling said metal-to-semiconductor contacts, said semiconductor body and said interconnectdd opposite conductivity regions to external circuitry.

DESCRIPTION OF THE DRAWINGS

FIG. 1A is a cross-section view of a portion of a semiconductor body showing a first embodiment of the cross-coupled semiconductor structure. FIG. 1B is the electrical equivalent circuit of FIG. 1A.

FIG. 2 is a top view of a portion of a semiconductor body showing a high density configuration of the basic cross-coupled semiconductor structure of FIG. 1A and 1B.

FIGS. 3A–H show the sequential processing steps for fabricating the semiconductor structure of FIGS. 1A and 1B.

DESCRIPTION OF THE PREFERRED EMBODIMENT

The cross-coupled semiconductor memory cell includes a one conductivity type semiconductor body 11 having a major surface 12, FIG. 1A. An opposite conductivity layer 13 is formed on surface 12 and has a planar surface 14 substantially parallel to major surface 12. A one conductivity isolation ring 16 extending from said planar surface 14 to contact surface 12, said ring extending to surround and isolate two portions of layer 13 to form isolated, opposite conductivity device regions 17 and 18. One conductivity regions 19 and 21 are formed in the respective device regions 17 and 18, each of said one conductivity regions being formed in said device region and extending to planar surface 14.

Opposite conductivity regions 22 and 23 are formed within the respective regions 19 and 21 and extend to planar surface 14. Metal-to-semiconductor contacts 24 and 27 are carried by each of the respective device regions 17 and 18 at surface 14. The metal-to-semiconductor contacts form separate devices, namely Schottky diodes at interfaces 26 and 28 respectively. Opposite conductivity contact regions 31 and 32 are formed within the respective device regions 17 and 18 and extend to surface 14. The contact regions 31 and 32 may be required to provide ohmic contact to regions 17 and 18 when said regions are formed of certain, particularly N conductivity material.

Lead means 33 and 34 are formed at the exposed surface of regions 22 and 23, and lead means 36 and 37 are formed at the exposed surfaces of regions 19 and 21. The later lead means 36 and 37 may be Schottky contacts which would then overlap onto regions 17 and 18. Lead means 38 and 39 are formed at the exposed surface of regions 31 and 32. Intercoupling means 41 is provided to intercouple Schottky lead means 37 and lead means 38. Intercoupling means 42 is formed to intercouple lead means 36 and 39. Intercoupling means 43 is provided to intercouple lead means 33 and 34. The lead means combination of lead means 44 to contact 24 and lead means 46 to contact 27, means 43 to 33 and 34 and lead means 47 contacting the body provides coupling of the respective regions to external circuitry.

The equivalent electrical circuit of FIG. 1A discloses the use of common regions on the cross-coupled memory cell, FIG. 1B. The heavy line 11' corresponds to body 11 in FIG. 1A. Similarly, the other prime reference 17' and 18' correspond to the respective device regions of the FIG. 1A structure. The combination of an NPN and a PNP transistor is conventionally used for showing an equivalent of a four layer SCR-type device. Referring to FIG. 2, a high density geometrical configuration of the FIG. 1A structure is shown. The structure differs only in that the separate cross-coupled devices are placed in a side-by-side topography. In FIG. 2, the callout 114 corresponds to surface 14 of FIG. 1A, 116 corresponds to isolation ring 16 of FIG. 1A and so forth. Intercoupling means 141, 142 and 143 have been shown schematically for purposes of illustration only, it being understood that the respective intercoupling means may be provided by multiple, isolated, patterned metal layers.

Turning to fabrication of the FIG. 1A device, semiconductor body 11 having major surface 12 has a layer 13 formed upon said surface, FIG. 3A. Layer 13 may be formed by conventional epitaxial processing, to provide a planar surface 14 substantially parallel to major surface 12. Next a conventional etch-resistant masking layer 15 is formed on surface 14 and has apertures or windows 15a opened in said layer to expose portions of surface 14. Next an anisotropic etch is applied to the exposed surfaces of surface 14 for a sufficient time to etch through layer 13 and expose portions of surface 12, FIG. 3B. Next layer 15 is removed and a semiconductor layer 16 having an outward portion 16a is formed on the surface 14 and in the etched grooves, FIG. 3C. Layer 16 may be formed of polycrystalline silicon formed using conventional processing methods. Next portion 16a of layer 16 is removed, such as by lapping, to again expose planar surface 14, FIG. 3D. Although polycrystalline filled V groove isolation has presently been shown, it is understood that other conventional methods of isolation such as open V grooves and open V grooves having doped walls may also be used, as well as conventional isolation deep diffusion.

Next an additional masking layer 20, such as silicon dioxide, is formed on surface 14 and has windows 20a formed therein to expose a portion of device regions 17 and 18 at surface 14, FIG. 3E. Regions 19 and 21 are then formed in the respective device regions 17 and 18 extending to surface 14 using mask 20. Next additional mask 20b is formed on surface 14 and has windows 20c formed therein exposing portions of surface 14 in the upper surface of device regions 17 and 18. Regions 22 and 23 and 31 and 32 are then simultaneously formed through said apertures, FIG. 3F. Mask 20b is then removed and an additional mask 25, the contact mask, is formed on surface 14 exposing a portion of each of respective regions at surface 14, FIG. 3G. Finally, a metal layer is formed on layer 25 and patterned to form contact 24 at interface 26, and contact 27 at interface 28. Further, lead means 33 is made to region 22 and lead means 34 to region 23. Lead means 36 and 37 are formed contacting exposed surface of regions 19 and 21; said contact may be a metal-to-semiconductor or Schottky contact. Finally, lead means 38 and 39 provide contact to regions 31 and 32, FIG. 3H.

It is of course possible to provide various intercoupling means between the respective regions in the structure of FIG. 1A. Patterned, multiple metal layers may be used as well as other known conventional intercoupling structures.

Thus it is apparent that there has been formed a high performance semiconductor switching structure suitable for use as a memory cell. In particular, an improved semiconductor memory cell switching structure has been shown which requires fewer device regions, contacts and interconnections than those presently known in the art. Moreover, the semiconductor structure is capable of high speed, low power operation and may be fabricated to provide vertical P-N-P regions by greatly simplified processing steps.

I claim:

1. In a semiconductor memory cell, a one conductivity semiconductor body having a major surface, an opposite conductivity layer formed on said major surface, said layer having a planar surface, means extending from said planar surface through said layer to contact said body for isolating portions of said layer into first and second device regions, said first and second device regions each including a one conductivity region formed in said device region and extending to said planar surface, including an opposite conductivity region formed within said one conductivity region and extending to said surface, and including a first rectifying metal-to-semiconductor contact carried by said device region at said planar surface, lead means having means for ohmic interconnection of each said opposite conductivity region formed in said one conductivity region, means for interconnection of said first device region and said one conductivity region formed in said second device region and means for interconnection of said second device region and said one conductivity region formed in said first device region and additional lead means for coupling said first metal-to-semiconductor contacts, said semiconductor body and said interconnected opposite conductivity regions to external circuitry.

2. A memory cell as in claim 1 wherein said means for interconnection includes electrically interconnected ohmic contacts to the respective regions.

3. A memory cell as in claim 1 wherein means for interconnection of said one conductivity region formed in said second device region and said first device region includes a metal-to-semiconductor contact carried by said one conductivity region at said planar surface electrically connected to an ohmic contact at said first device region and wherein means for interconnection of said one conductivity region formed in said first device region and said second device region includes a metal-to-semiconductor contact carried by said one conductivity region at said planar surface electrically interconnected to an ohmic contact at said second device region.

4. A memory cell as in claim 1 wherein said one conductivity is N type material and said opposite conductivity is P type material.

5. A memory cell as in claim 1 wherein said one conductivity is P type material and wherein said opposite conductivity is N type material.

6. A memory cell as in claim 3 wherein one conductivity is P type material and opposite conductivity is N type material and wherein ohmic contacts to said N type device regions are provided by an additional N+ contact region formed in each of said first and second device regions and extending to the surface thereof.

7. A memory cell as in claim 6 wherein said means extending from said planar surface to contact said body for isolating said layer into first and second device regions includes a one conductivity isolation ring extending from said planar surface through said layer to contact said body, said ring extending to surround portions of said layer to form isolated device regions.

8. A semiconductor memory cell comprising,
first and second cross-coupled semiconductor devices each formed with P,N,P,N regions in a four-region vertical structure which structure comprises for said first and second devices first and second PNP transistors, respectively, and first and second NPN transistors, respectively, where said first transistors have common PN regions and where said second transistors have common PN regions, said regions including a first P region semiconductor body having a major surface and comprising a common emitter for said first and second PNP transistors,
said regions for each of said devices, including,
   a first N region forming a layer on said major surface, said layer having a planar surface, said first N region comprising the base of said PNP transistor and the collector of said NPN transistor,
   a second P region formed in said first N region and extending to said planar surface, said second P region comprising the collector of said PNP transistor and the base of said NPN transistor,
   a second N region formed within said second P region and extending to said planar surface, said second N region comprising the emitter of said NPN transistor,
   an isolation region extending from said planar surface through said layer and between said first and second devices to said body,
first and second rectifying metal-to-semiconductor contacts connected, respectively, to said first N region, at said planar surface, of said first and second devices,
means for interconnection of said second P region of said first device to said first N region of said second device,
means for interconnection of said second P region of said second device to said first N region of said first device,
means for interconnection of said second N region of said first and second devices.

* * * * *